United States Patent
Kim et al.

(10) Patent No.: US 8,128,738 B2
(45) Date of Patent: Mar. 6, 2012

(54) METHOD OF DRYING AN OBJECT AND APPARATUS FOR PERFORMING THE SAME

(75) Inventors: Kuen-Byul Kim, Hwaseong-si (KR); In-Gi Kim, Yongin-si (KR); Dae-Bum Park, Yongin-si (KR); Soung-Kil Ryu, Hwaseong-si (KR); Seung-Bu Baek, Hwaseong-si (KR); Seo-Hyun Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1152 days.

(21) Appl. No.: 11/826,368

(22) Filed: Jul. 13, 2007

(65) Prior Publication Data

US 2008/0022854 A1    Jan. 31, 2008

(30) Foreign Application Priority Data

Jul. 14, 2006    (KR) .................. 10-2006-0066228

(51) Int. Cl.
*B01D 46/00*    (2006.01)

(52) U.S. Cl. ............................ 95/273; 55/385.2; 34/343

(58) Field of Classification Search ............... 95/273; 55/385.1, 385.2; 34/343, 409, 412, 493, 34/549

See application file for complete search history.

(56) References Cited

U.S. PATENT DOCUMENTS 6,134,807 A * 10/2000 Komino et al. ............... 34/418
7,637,029 B2 * 12/2009 Kamikawa et al. ............. 34/78

FOREIGN PATENT DOCUMENTS

| JP | 11-354485 | 12/1999 |
| JP | 2000-055543 | 2/2000 |
| KR | 1999-029868 | 4/1999 |

* cited by examiner

*Primary Examiner* — Robert A Hopkins
(74) *Attorney, Agent, or Firm* — Harness, Dickey & Pierce, P.L.C.

(57) ABSTRACT

In a method of drying an object, a first drying fluid and a second dry fluid may be first heated to form a gas mixture. The gas mixture may be second heated to prevent the mixed gas from condensing. The second heated gas mixture may be filtered to remove impurities from the second heated mixed gas. The filtered mixed gas may be then applied to the object so as to dry the object.

23 Claims, 5 Drawing Sheets

METHOD OF DRYING AN OBJECT AND APPARATUS FOR PERFORMING THE SAME

PRIORITY CLAIM

A claim of priority is made under 35 USC §119 to Korean Patent Application No. 2006-66228 filed on Jul. 14, 2006, the contents of which are herein incorporated by reference in their entirety.

BACKGROUND

1. Field of the Example Embodiments

Example embodiments of the present invention may relate to a method of drying an object, and an apparatus for performing the same.

2. Description of the Related Art

Generally, during the various manufacturing processes for forming an integrated circuit on a semiconductor substrate, contaminants, for example, particles may adhere to the integrated circuit. The contaminants may deteriorate electrical characteristics of the integrated circuit. Thus, a cleaning process may be performed in between the various manufacturing processes to remove the contaminants from the integrated circuit.

The cleaning process may include a chemical solution treatment process, a washing process, and/or a drying process. The chemical solution treatment process may remove the contaminants by treating the semiconductor substrate with a chemical solution. The washing process may wash the chemically treated semiconductor substrate with deionized water. The drying process may dry off the deionized water remaining on the semiconductor substrate.

A spin dryer may be used in the conventional drying method. However, droplets of deionized water on the semiconductor substrate may not be completely removed when using the conventional spin drying method. Further, vortexes generated by a rapid rotation of the semiconductor substrate during the spin drying process may contaminate the semiconductor substrate.

To solve the above-mentioned problems, a method of drying a semiconductor substrate using isopropyl alcohol (IPA) may be employed. This method utilizes the Marangoni Effect, for example, and relies on the low surface tension of IPA vapors.

According to the drying method employing the Marangoni Effect, nitrogen gas and IPA may be first heated until the nitrogen gas and the IPA are evaporated to form a gas mixture. The gas mixture may pass through a metal filter, which may remove impurities from the gas mixture. The filtered gas mixture may be heated to prevent the gas mixture from condensing. The heated gas mixture may be applied to a semiconductor substrate to dry the semiconductor substrate.

Generally, a capacitor may be formed in integrated circuits on a semiconductor substrate. To increase a capacitance of the capacitor, a plurality of capacitors, which may be formed in a small region of the semiconductor substrate, may have a height of about 18,000 Å to about 20,000 Å. When the capacitors are tall, one or more capacitors may lean and touch an adjacent capacitor, which may cause malfunction of the integrated circuit.

A method of preventing the leaning of the capacitors may include completely removing moisture between the capacitors by a drying process. In the conventional method, after the IPA vapor passes through the metal filter, the IPA vapor may be heated. However, impurities may remain in the heated IPA vapor, whereby a cohesive force between the IPA vapor and the nitrogen gas may be decreased. While the IPA vapor is supplied to a drying chamber, the IPA vapor may partially condense; thereby decreasing the amount of the IPA vapor applied to the capacitors. As a result, the moisture between the capacitors may not be completely removed, and causing the capacitors to lean.

SUMMARY

Example embodiments of the present invention may provide a method capable of providing a sufficient amount of an IPA vapor to dry an object.

Example embodiments of the present invention may also provide an apparatus for performing the above-mentioned method.

In an example embodiment, a method of drying an object may include first heating a first fluid and a second fluid to form a gas mixture, second heating the first heated gas mixture, filtering the second heated gas mixture to filter impurities from the second heated gas mixture, and applying the filtered gas mixture to the object to dry the object.

In another example embodiment, a method of drying a semiconductor substrate having capacitors formed thereon may include preheating a nitrogen gas, and first heating the preheated nitrogen gas and isopropyl alcohol (IPA) to form a gas mixture. The method may further include second heating the first heated gas mixture, filtering the second heated gas mixture to filter impurities from the second heated gas mixture, applying the filtered gas mixture to dry the semiconductor substrate having the capacitors, and applying only the nitrogen gas to remove the gas mixture remaining on the semiconductor substrate having the capacitors.

In an example embodiment, an apparatus for drying an object may include at least one first heater configured to first heat a first drying fluid and a second drying fluid to form a gas mixture, a second heater connected to the first heater and configured to second heat the first heated gas mixture for preventing a condensation of the gas mixture, and a filter configured to filter impurities from the second heated gas mixture and arranged between the second heater and a drying chamber into which the object is loaded.

BRIEF DESCRIPTION OF THE DRAWINGS

Example embodiments may become readily apparent by reference to the following detailed description when considered in conjunction with the accompanying drawings wherein.

DESCRIPTION OF THE EMBODIMENTS

Figure 1:
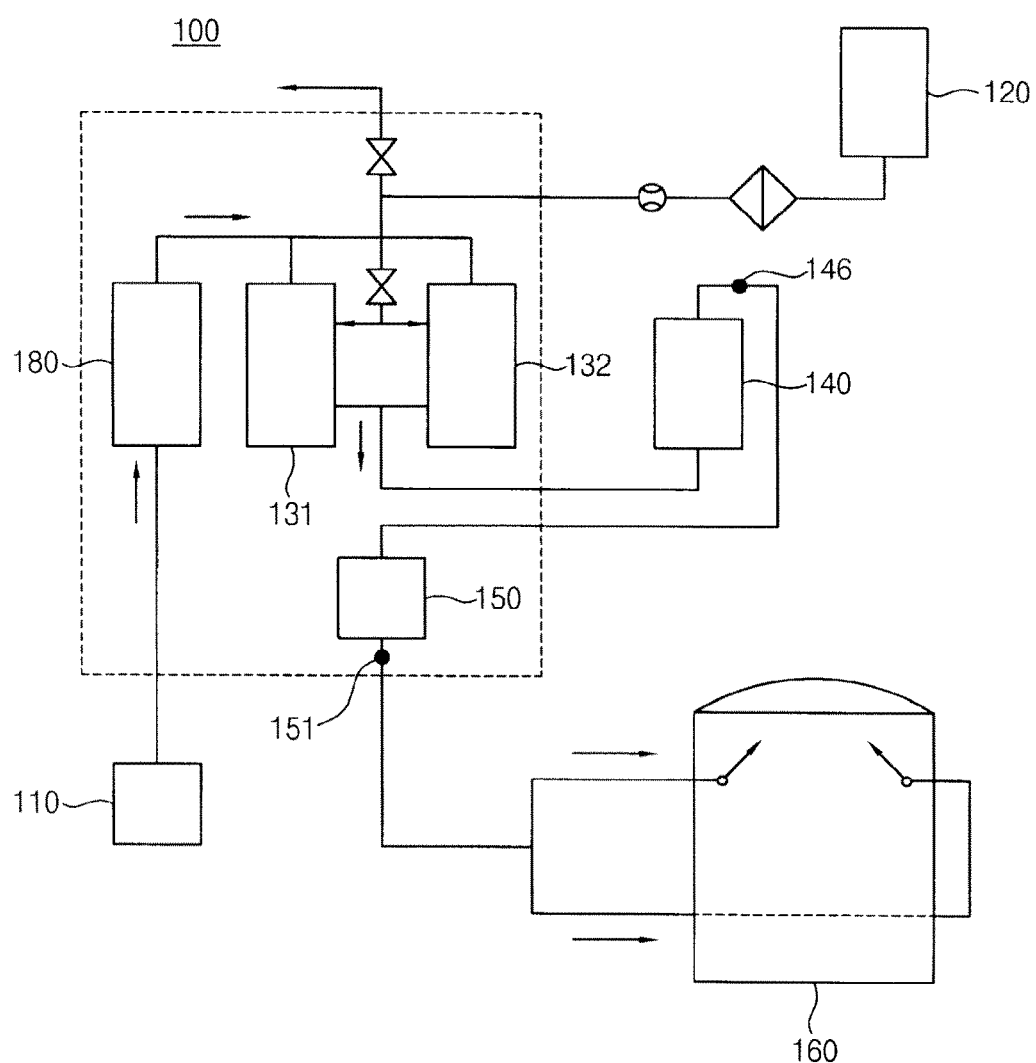
FIG. 1 is a block diagram illustrating an apparatus for drying a semiconductor substrate in accordance with an example embodiment of the present invention.

Example embodiments of the present invention may be described more fully hereinafter with reference to the accompanying drawings. The example embodiments may, however, be embodied in many different forms and should not be construed as limited to the embodiments set forth herein. Rather, these example embodiments may be provided so that this disclosure will be thorough, and will convey the scope of the example embodiments to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the embodiments. As used herein, the singular forms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Drying Apparatus

Figure 2:
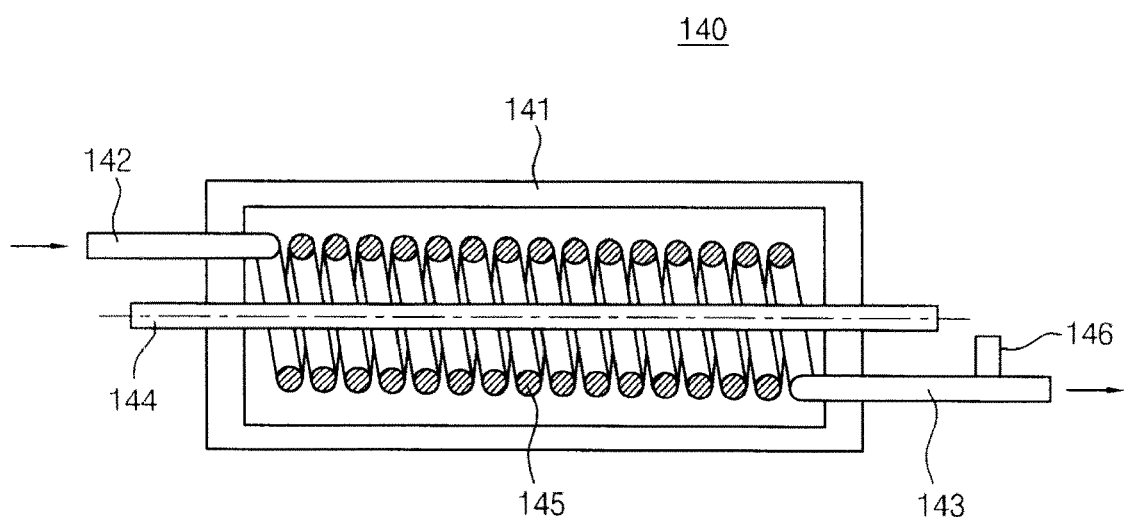
FIG. 2 is an enlarged cross-sectional view illustrating a second heater of the apparatus illustrated in FIG. 1.

FIG. 1 is a block diagram illustrating an apparatus for drying a semiconductor substrate in accordance with an example embodiment of the present invention, and FIG. 2 is an enlarged cross-sectional view illustrating a second heater of the apparatus illustrated in FIG. 1.

Referring to FIG. 1, a drying apparatus 100 may include a first tank 110, a second tank 120, two first heaters 131 and 132, a second heater 140, a filter 150, and a drying chamber 160.

An object to be dried, for example, a semiconductor substrate may be loaded into the drying chamber 160. In an example embodiment, cylindrical capacitors may be formed on the object such as the semiconductor substrate. The cylindrical capacitors may be formed to have a height of about 18,000 Å to about 20,000 Å. Further, the semiconductor substrate having the cylindrical capacitors may have been previously cleaned with deionized water prior to being loaded into the drying chamber 160.

A first drying fluid may be stored in the first tank 110. The first drying fluid may be a nitrogen gas. The first tank 110 may be connected to each of the first heaters 131 and 132 through respective lines. In addition, a preheater 180 may be arranged between the first tank 110 and the first heaters 131 and 132. The preheater 180 may preheat the nitrogen gas to a desired temperature to reduce the time the first heaters 131 and 132 heat the nitrogen gas to another desired temperature. The first heaters 131 and 132 may be a far-infrared heater.

A second drying fluid may be stored in the second tank 120. The second drying fluid may be isopropyl alcohol (IPA).

The first heaters 131 and 132 may be connected to the first tank 110 and the second tank 120. Thus, the nitrogen gas supplied from the first tank 110 and preheated by the preheater 180, and the IPA supplied from the second tank 120 may be mixed in the first heaters 131 and 132 to form a drying fluid mixture. The first heaters 131 and 132 may first heat the drying fluid mixture to an evaporation temperature of the IPA or more, to form a gas mixture. Since the evaporation temperature of the IPA may be about 82.4° C., the first heaters 131 and 132 may first heat the drying fluid mixture to a temperature of no less than about 82.4° C. Although in an example embodiment, the number of the first heaters is two, a person of ordinary skill will appreciate that any number of heaters may be provided and used.

The second heater 140 may be connected to the first heaters 131 and 132. The second heater 140 may secondarily heat the gas mixture to prevent the gas mixture, for example, the IPA vapor from condensing while the gas mixture flows toward the drying chamber 160. The IPA vapor may condense when the temperature of the gas mixture falls below about 82.4° C. In an example embodiment, the second heater 140 may be arranged between the first heaters 131 and 132 and the filter 150. Therefore, before the gas mixture passes through the filter 150, the second heater 140 may heat the gas mixture, so that the filter 150 removes impurities from the gas mixture prior to applying the gas mixture to the drying chamber 160. As a result, the gas mixture may retain a strong cohesive force, and sufficient amounts of the gas mixture, for example, the IPA vapor may be applied to the semiconductor substrate to efficiency dry the object such as the semiconductor substrate.

FIG. 2 details an internal structure of the second heater 140. With reference to FIG. 2, the second heater 140 may be a far-infrared heater, which may include a heater body 141, an inlet 142, an outlet 143, a coiled passageway 145 and a halogen lamp 144. Here, a wavelength of a far-infrared ray emitted from the halogen lamp may be chosen based on the molecular material (e.g., IPA) used in the gas mixture such that a radiation energy of the far-infrared ray may be more readily absorbed in the molecular material of the gas mixture, for example, the IPA. As a result, the gas mixture may be heated to a desired temperature within a short time.

The inlet 142 may be connected between the heater body 141 and the first heaters 131 and 132. Thus, the first heated gas mixture may flow into the second heater 140 through the inlet 142. The outlet 143 may be connected between the heater body 141 and the filter 150. Thus, the gas mixture heated by the second heater 140 may flow into the filter 150 through the outlet 143.

The coiled passageway 145 may be connected between the inlet 142 and the outlet 143. Thus, the gas mixture may flow through the coiled passageway 145 in the second heater 140.

The halogen lamp 144 may be disposed in the coiled passageway 145 to heat the gas mixture in the coiled passageway 145.

Additionally, a first thermometer 146 to measure a temperature of the heated gas mixture may be installed in the outlet 143. A thermocouple may be used as the first thermometer 146. A temperature of the gas mixture heated by the second heater 140 may be about 280° C.

The filter 150 may be arranged between the second heater 140 and the drying chamber 160. The filter 150 may remove impurities from the heated gas mixture. For example, a metal filter may be used as the filter 150. The metal filter may function to heat the gas mixture for a third time as well as remove the impurities in the second heated gas mixture.

A second thermometer 151 to measure a temperature of the heated gas mixture may be installed in an exit outlet of the filter 150. A thermocouple may be used as the second thermometer 151. A temperature of the heated gas mixture exiting the filter 150 may be about 210° C.

The gas mixture passing through the filter 150 may be introduced into the drying chamber 160. The gas mixture may be supplied to the drying chamber 160 at a temperature of about 140° C. to about 180° C. for about 90 seconds. The introduced gas mixture may be applied to the semiconductor substrate in the drying chamber 160 to dry the semiconductor substrate. Since the gas mixture may be heated by the second heater 140, a condensation of the gas mixture (IPA vapor) may be reduced when the gas mixture flows toward the drying chamber 160. Thus, a sufficient amount of the IPA vapor may be applied to the semiconductor substrate so that, for example, capacitors formed on the semiconductor substrate may be sufficiently dried within a short period of time. Further, the gas mixture may dry (remove) any deionized water remaining between the cylindrical capacitors to reduce/prevent leaning of the cylindrical capacitors.

Drying Method

Figure 3:
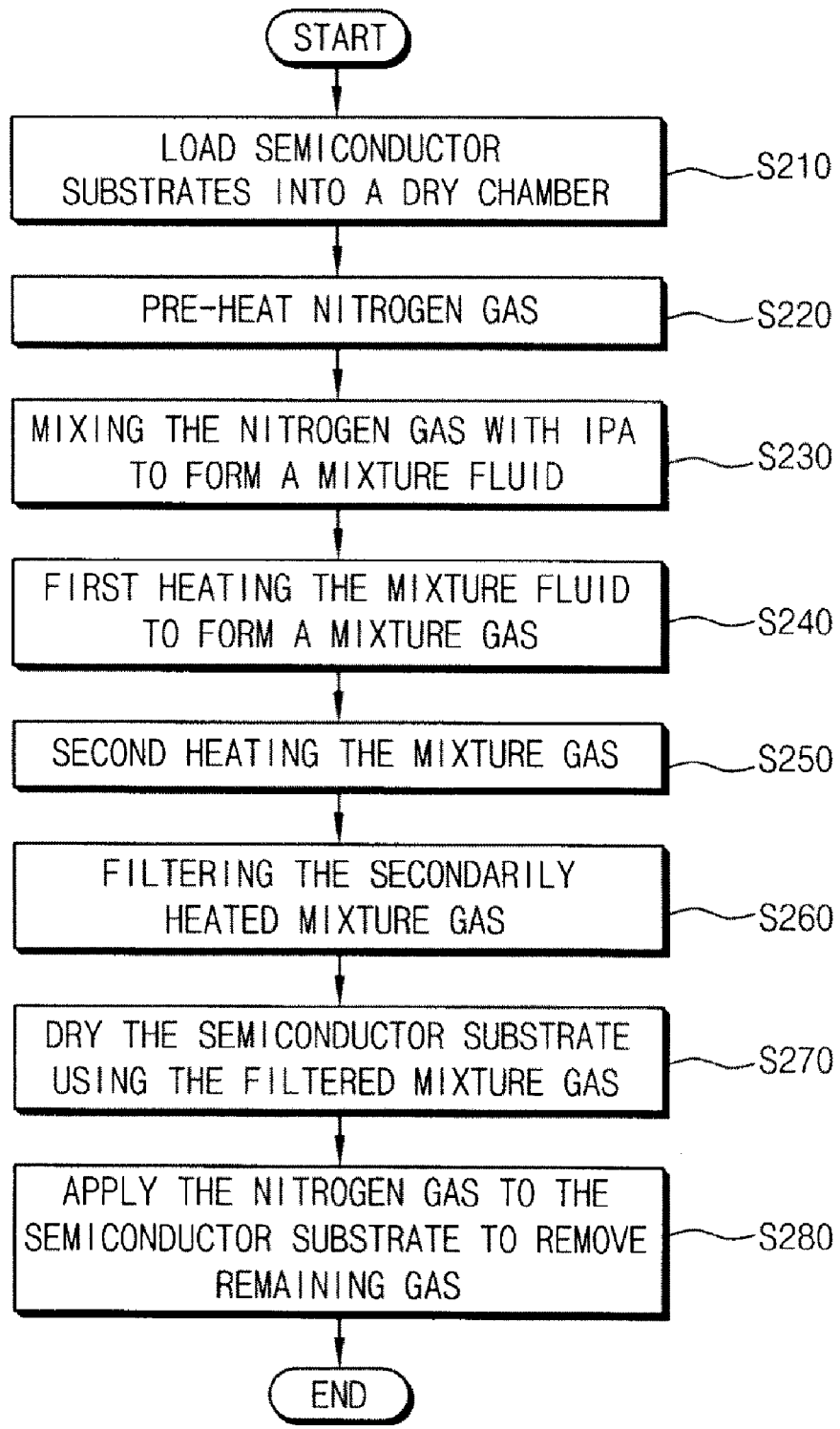
FIG. 3 is a flow chart illustrating a method of drying a semiconductor substrate using the apparatus illustrated in FIG. 1.

FIG. 3 is a flow chart illustrating a method of drying a semiconductor substrate using the apparatus illustrated in FIG. 1.

Referring to FIGS. 1 and 3, in step S210, semiconductor substrate(s) having cylindrical capacitors formed thereon to a height of no less than about 18,000 Å may be cleaned using deionized water. The semiconductor substrate(s) may then be loaded into the drying chamber 160.

In step S220, a nitrogen gas from the first tank 110 may be supplied to the preheater 180. The preheater 180 may preheat the nitrogen gas.

In step S230, isopropyl alcohol (IPA) from the second tank 120 may be supplied to the first heaters 131 and 132. Simultaneously, the preheated nitrogen gas may be supplied to the first heaters 131 and 132. Thus, the nitrogen gas and the IPA may be mixed in the first heaters 131 and 132 to form a fluid mixture.

In step S240, the first heaters 131 and 132 may first heat the drying fluid mixture to form a gas mixture. For example, the first heaters 131 and 132 may first heat the mixture to an evaporation temperature of the IPA, for example, about 82.4° C. to form the gas mixture.

In step S250, the gas mixture may be supplied to the second heater 140. The second heater 140 may heat the gas mixture to reduce the condensation of the gas mixture, for example, the condensation of the IPA vapor when the gas mixture flows toward the drying chamber 160. A first thermometer 146 may then measure a temperature of the gas mixture flowing out of the second heater 140.

In step S260, the heated gas mixture may pass through the filter 150 to remove any impurities from the gas mixture. Simultaneously, the filter 150 may heat the gas mixture. Since the filter 150 may remove impurities from the heated gas mixture, the condensation of the gas mixture, for example, a condensation of the IPA vapor may be further reduced. Thus, a sufficient amount of the IPA vapor may be applied to the semiconductor substrate. A second thermometer 151 may then measure a temperature of the gas mixture passing through the filter 150.

In step S270, the filtered gas mixture may be supplied into the drying chamber 160. The gas mixture in the drying chamber 160 may be applied to the semiconductor substrate to dry the semiconductor substrate including, for example, the capacitors formed thereon. The gas mixture supplied into the drying chamber 160 may have a temperature of about 140° C. to about 180° C. Further, the gas mixture may be introduced into the drying chamber 160 for about 90 seconds.

Since the gas mixture may be heated by the second heater 140 and then passed through the filter 150, impurities in the gas mixture may be effectively reduced/removed. Thus, a sufficient amount of the IPA vapor may be applied to effectively remove deionized water remaining, for example, between the capacitors. As a result, leaning of the capacitors due to remaining deionized water may be reduced.

In step S280, the supply of the IPA vapor to the first heaters 131 and 132 may be suspended, and only the nitrogen gas may be supplied to the drying chamber 160 through the first heaters 131 and 132, the second heater 140, and the filter 150 to remove any IPA remaining on the semiconductor substrate.

In an example embodiment, the semiconductor substrate including the capacitors has been illustrated as a drying object. Alternatively, methods and apparatuses of the example embodiments may be employed to dry other objects, for example, a substrate for a liquid crystal display (LCD), etc.

Evaluating Dry Capacity

Comparative Example

A capacitor having a height of 19,000 Å was formed on a semiconductor substrate. The semiconductor substrate was cleaned twice using deionized water. The semiconductor substrate was then loaded into a drying chamber.

A nitrogen gas was preheated. A first heater first heated the preheated nitrogen gas and IPA to form a gas mixture. The gas mixture was passed through a metal filter to remove impurities from the gas mixture. After filtering, a second heater heated the filtered gas mixture. The second heated gas mixture was supplied into the drying chamber for 90 seconds. IPA vapor in the mixture gas was supplied into the drying chamber at a temperature of 150° C. at a flow rate of 2.0 ml/s.

Figure 4:
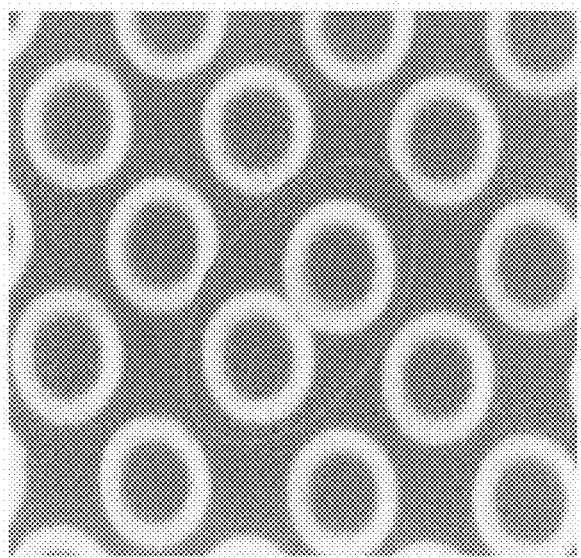
FIG. 4 is a scanning electron microscope (SEM) picture showing a capacitor dried in accordance with a Comparative Example.

FIG. 4 is a scanning electron microscope (SEM) picture illustrating a capacitor dried in accordance with this Comparative Example. As shown in FIG. 4, a capacitor leans towards an adjacent capacitor, such that the capacitors stick to each other. Thus, when the capacitors are dried in accordance with the Comparative Example, it may be noted that the deionized water remaining between the capacitors may not have been completely removed.

Drying Capacitors in Accordance with the Method of the Example Embodiment

Example

A capacitor having a height of 19,000 Å was formed on a semiconductor substrate. The semiconductor substrate was cleaned twice using deionized water. The semiconductor substrate was then loaded into a drying chamber.

A nitrogen gas was preheated. A first heater heated the preheated nitrogen gas and IPA to form a gas mixture. A second heater heated the gas mixture. The second heated gas mixture was passed through a filter to remove impurities from the gas mixture. The filtered gas mixture was supplied into the drying chamber for 90 seconds. IPA vapor in the gas mixture was supplied into the drying chamber at a temperature of 200° C. at a flow rate of 4.0 ml/s.

Figure 5:
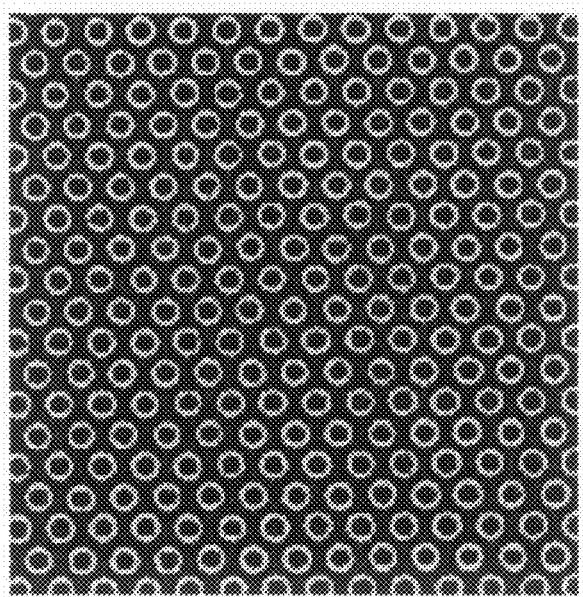
FIG. 5 is a scanning electron microscope (SEM) picture showing a capacitor dried in accordance with an Example of the present invention.

FIG. 5 is a scanning electron microscope (SEM) picture illustrating a capacitor dried in accordance with the Example. As shown in FIG. 5, no capacitor leans towards any other adjacent capacitor. Thus, it may be noted that the deionized water remaining between the capacitors may have been completely removed. As a result, when the capacitors are dried in accordance with the Example, leaning of the capacitors may be reduced/prevented.

Figure 6:
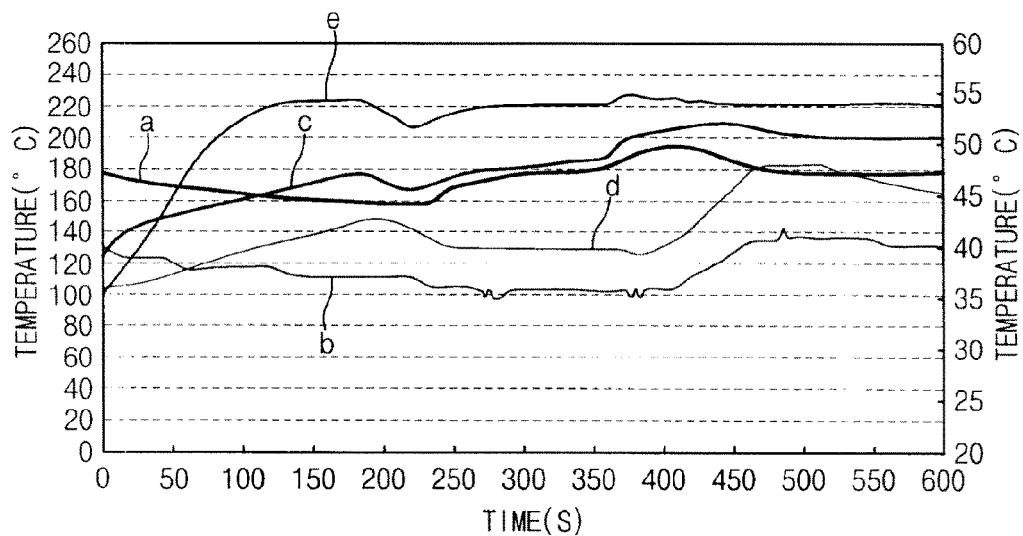
FIG. 6 is a graph illustrating temperatures in each of the drying processes in accordance with the Comparative Example and the Example.

FIG. 6 is a graph illustrating temperatures in each drying process in accordance with the Comparative Example and the Example. In FIG. 6, the temperatures correspond to temperatures of the first heater, the second heater and the drying chamber in a pre-cleaning process, a main cleaning process, a drying process using the IPA, and a drying process using the nitrogen gas. Further, in FIG. 6, the left vertical axis represents temperatures of the IPA and the nitrogen gas, the right vertical axis indicates the temperature of the drying chamber, and the horizontal axis represents time. Furthermore, line a represents a temperature of the first heater in the Comparative Example; line b represent a temperature of the drying chamber in the Comparative Example; line c represents a temperature of the first heater in the apparatus of the Example; line d represents a temperature of the drying chamber in the apparatus of the Example; and line e represents a temperature of the second heater in the apparatus of the Example.

As shown in FIG. 6, when line a is compared to line c, line c is higher than line a. Thus, the first heater of the apparatus in accordance with the Example has a temperature higher than that of the apparatus in the Comparative Example. Further, when line b is compared to line d, line d is higher than line b. Thus, the drying chamber of the apparatus in accordance with the Example has a temperature higher than that of the apparatus in the Comparative Example. Furthermore, as indicated by line e, the IPA heated by the second heater has a high temperature. Thus, the apparatus of the Example may provide the IPA with a temperature that is higher than that of the IPA in the Comparative Example, which may sufficiently supply IPA to the semiconductor substrate. As a result, removal of the deionized water between the capacitors may be improved.

Figure 7:
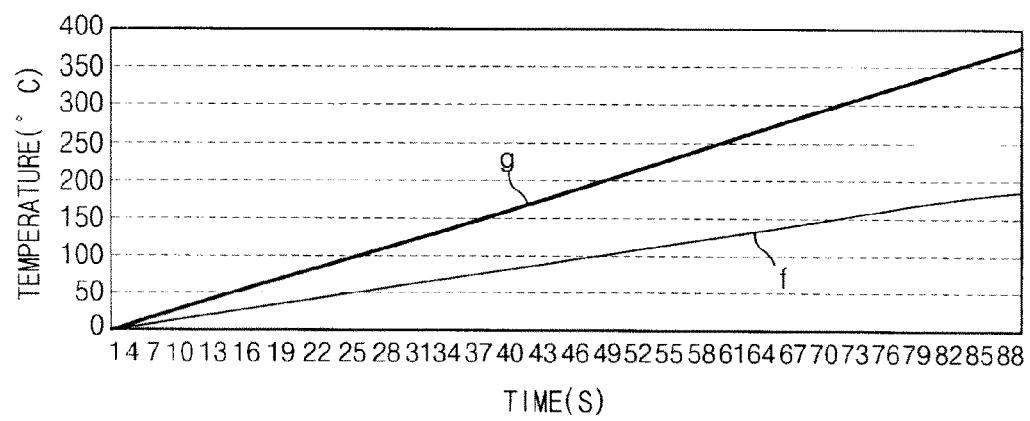
FIG. 7 is a graph illustrating amounts of IPA that were supplied to a semiconductor substrate in accordance with the Comparative Example and the Example.

FIG. 7 is a graph illustrating an amount of IPA that may be applied to a semiconductor substrate in accordance with the Comparative Example and the Example. In FIG. 7, a vertical axis indicates an amount (cc) of the IPA, and a horizontal axis represents time (seconds). Further, line g represents an amount of the IPA supplied in accordance with the Comparative Example, and line f represents an amount of the IPA applied in accordance with the method of the Example.

As shown in FIG. 7, line f increases more than line g in proportion to the elapse of time. Therefore, a sufficient amount of the IPA using the method of the Example may be supplied to the semiconductor substrate.

According to example embodiments of the present invention, after the first heated gas mixture is second heated, the second heated gas mixture may pass through the filter. Thus, the condensation of the gas mixture flowing toward the drying chamber may be reduced. Therefore, a sufficient amount of the gas mixture, for example, the IPA may be applied to the semiconductor substrate to reduce/remove any deionized water remaining between the capacitors. As a result, leaning of the capacitors may be reduced.

Having described the example embodiments, it is noted that modifications and variations can be made by persons skilled in the art in light of the above teachings. It is therefore to be understood that changes may be made in the particular example embodiments disclosed which is within the scope of the invention.

What is claimed is:

1. A method of drying an object, comprising:
   first heating a first fluid and a second fluid to form a first heated gas mixture;
   second heating the first heated gas mixture to form a second heated gas mixture;
   filtering the second heated gas mixture to remove impurities from the second heated gas mixture to form a filtered gas mixture; and
   applying the filtered gas mixture to the object to dry the object.

2. The method of claim 1, wherein the first fluid includes a nitrogen gas, and the second fluid includes isopropyl alcohol (IPA).

3. The method of claim 1, further comprising preheating the first fluid.

4. The method of claim 1, wherein the filtering the second heated gas mixture comprises third heating the second heated gas mixture.

5. The method of claim 1, after applying the filtered gas mixture, further comprising:
   applying only the first fluid to the object to remove the filtered gas mixture remaining on the object.

6. The method of claim 1, further comprising:
   measuring a temperature of the second heated gas mixture after second heating the first heated gas mixture.

7. The method of claim 1, further comprising:
   measuring a temperature of the filtered gas mixture after filtering the second heated gas mixture.

8. The method of claim 1, wherein the object includes a semiconductor substrate having a plurality of capacitors formed thereon.

9. The method of claim 1, wherein the object includes a liquid crystal display substrate.

10. A method of drying a semiconductor substrate having capacitors formed thereon, comprising:
- preheating a nitrogen gas;
- first heating the preheated nitrogen gas and isopropyl alcohol (IPA) to form a first heated gas mixture;
- second heating the first heated gas mixture to form a second heated gas mixture;
- filtering the second heated gas mixture to remove impurities from the second heated gas mixture to form a filtered gas mixture;
- applying the filtered gas mixture to the semiconductor substrate having the capacitors; and
- applying only the nitrogen gas to remove the IPA remaining on the semiconductor substrate having the capacitors.

11. The method of claim 10, wherein the preheated nitrogen gas and IPA are first heated to at least a temperature of about 82.4° C.

12. The method of claim 10, wherein the first heated gas mixture is second heated to a temperature of about 210° C.

13. The method of claim 10, wherein the filtered gas mixture is applied to the semiconductor substrate having the capacitors at a temperature between about 140 and 180° C. for about 90 seconds at a flow rate about 4.0 ml/s.

14. The method of claim 10, wherein the filtering the second heated gas mixture comprises third heating the second heated gas mixture.

15. The method of claim 10, further comprising:
- measuring a temperature of the filtered gas mixture after filtering the second heated gas mixture.

16. The method of claim 10, further comprising:
- measuring a temperature of the second heated gas mixture after second heating the first heated gas mixture.

17. An apparatus for drying an object, comprising:
- at least one first heater configured to first heat a first drying fluid and a second drying fluid to form a first heated gas mixture;
- a second heater connected to the first heater and configured to second heat the first heated gas mixture to form a second heated has mixture; and
- a filter configured to remove impurities from the second heated gas mixture to form a filtered gas mixture, the filter arranged between the second heater and a drying chamber for containing the object.

18. The apparatus of claim 17, further comprising:
- a first thermocouple configured to measure a temperature of the second heated gas mixture; and
- a second thermocouple configured to measure a temperature of the filtered gas mixture.

19. The apparatus of claim 17, wherein the first heater includes an infrared heater.

20. The apparatus of claim 17, wherein the second heater includes an infrared heater.

21. The apparatus of claim 17, wherein the filter includes a metal filter.

22. The apparatus of claim 17, further comprising:
- a first tank connected to the first heater and adapted to hold the first drying fluid; and
- a second tank connected to the first heater and adapted to hold the second drying fluid.

23. The apparatus of claim 17, further comprising:
- a preheater connected between the first tank and the first heater and configured to preheat the first drying fluid.

* * * * *